United States Patent

Kowanz et al.

[11] Patent Number: 5,260,175
[45] Date of Patent: Nov. 9, 1993

[54] METHOD OF PRODUCING MICROSTRUCTURES HAVING REGIONS OF DIFFERENT STRUCTURAL HEIGHT

[75] Inventors: Bernd Kowanz, Öhringen; Peter Bley, Eggensten-Leopoldshafen; Walter Bacher, Stutensee; Michael Harmening, Hirschberg; Jürgen Mohr, Sulzfeld, all of Fed. Rep. of Germany

[73] Assignees: Kernforschungzentrum Karlsruhe GmbH, Karlsruhe; Bürkert GmbH & Co., Ingelfingen, both of Fed. Rep. of Germany

[21] Appl. No.: 844,586

[22] PCT Filed: Jul. 25, 1991

[86] PCT No.: PCT/DE91/00602
§ 371 Date: Mar. 31, 1992
§ 102(e) Date: Mar. 31, 1992

[87] PCT Pub. No.: WO92/02858
PCT Pub. Date: Feb. 20, 1992

[30] Foreign Application Priority Data
Jul. 31, 1990 [DE] Fed. Rep. of Germany ....... 4024275

[51] Int. Cl.⁵ ............................. G03F 7/16; G03F 7/30
[52] U.S. Cl. ..................................... 430/326; 430/327; 430/8; 430/967; 430/312; 264/370; 156/249.17; 156/244.14
[58] Field of Search ............... 430/326, 327, 967, 312, 430/8; 264/320; 156/244.17, 244.24

[56] References Cited

U.S. PATENT DOCUMENTS

| | | |
|---|---|---|
| 4,349,621 | 9/1982 | Cline . |
| 4,393,129 | 7/1983 | Glashauser et al. . |
| 4,703,559 | 11/1987 | Ehrfeld et al. . |
| 4,845,014 | 7/1989 | Ladany ............................... 430/326 |
| 5,073,237 | 12/1991 | Bacher et al. . |
| 5,104,772 | 4/1992 | Kobayashi et al. .................. 430/967 |

FOREIGN PATENT DOCUMENTS

| | | |
|---|---|---|
| 3039110 | 5/1982 | Fed. Rep. of Germany . |
| 3133350 | 3/1983 | Fed. Rep. of Germany . |
| 3443400 | 6/1985 | Fed. Rep. of Germany . |
| 3440110 | 5/1986 | Fed. Rep. of Germany . |
| 3623637 | 1/1988 | Fed. Rep. of Germany . |
| 4010669 | 4/1990 | Fed. Rep. of Germany . |
| 8901632 | 2/1989 | PCT Int'l Appl. . |

OTHER PUBLICATIONS

Kfk 3995, Nov. 1985 "Herstellung von Mikrostrukturen mit grossem Aspektverhältnis . . ."; E. W. Becker et al. (No translation) (English Abstract).
KfK 4267, May 1987 "Untersuchungen zur Herstellung von galvanisierbaren Mikrostrukturen . . . "; H. Vollmer et al. (No translation) (English Abstract).

*Primary Examiner*—Christopher D. Rodee
*Attorney, Agent, or Firm*—Spencer, Frank & Schneider

[57] ABSTRACT

A method of producing microstructures having regions of different structural height includes providing a layer of positive resist material that is sensitive to X-ray radiation with microstructures on a side facing a source of X-rays. Using a mask, the layer of a positive resist material is partially irradiated with the X-rays. The irradiated regions are removed with the aid of a developer.

5 Claims, 2 Drawing Sheets

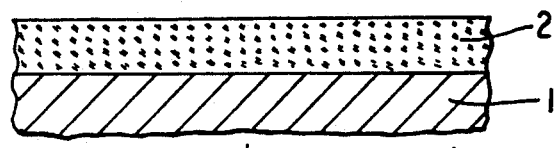
FIG. 1
FIG. 2a  FIG. 2b  FIG. 2c
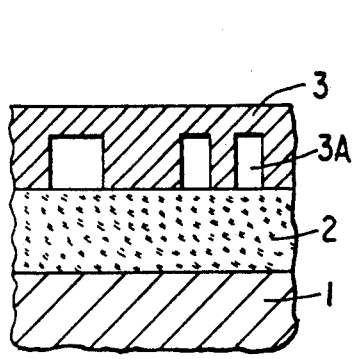 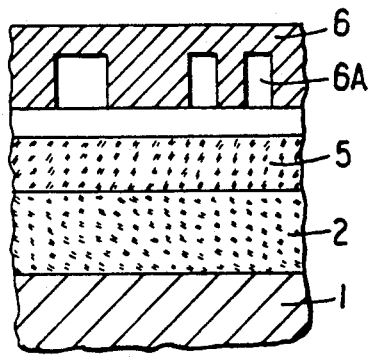 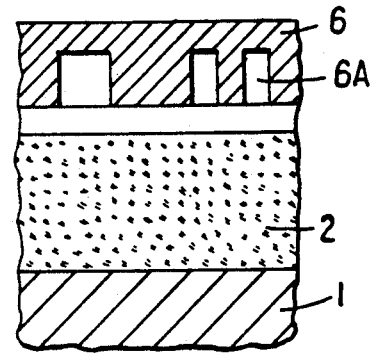
FIG. 3a  FIG. 3b  FIG. 3c
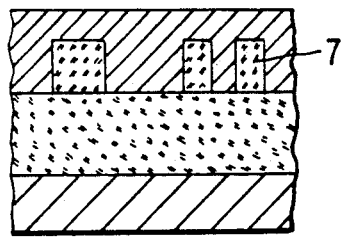 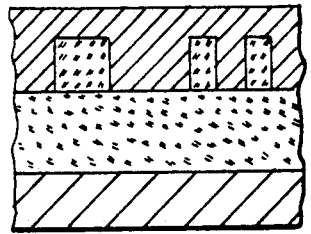 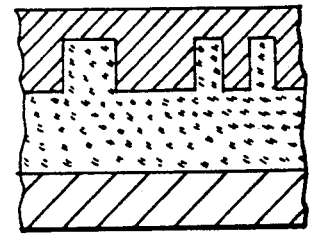
FIG. 4a  FIG. 4b  FIG. 4c
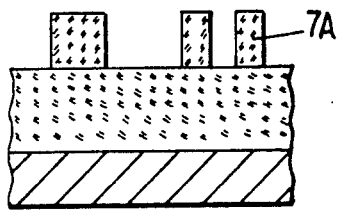 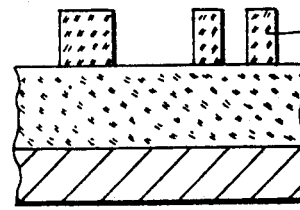 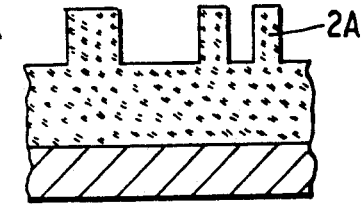

METHOD OF PRODUCING MICROSTRUCTURES HAVING REGIONS OF DIFFERENT STRUCTURAL HEIGHT

BACKGROUND OF THE INVENTION

1. Field of the Invention

The invention relates to a method of producing microstructures having, for example, a different structural height. In particular, the invention relates to a method of producing microstructures having regions of different structural height using a mask, positive x-ray sensitive resist material, and a developer.

2. Background Information

Such a method is disclosed in German Patent No. 3,623,637. In this process, a layer of a positive resist material is partially irradiated with X-ray radiation, with an X-ray mask being employed which is provided with a structured absorber layer that substantially completely absorbs the synchrotron radiation and with at least one further structured absorber layer which absorbs synchrotron radiation preferably only in one part of the spectrum.

A polymer having a sharply defined lower limit dose is employed as the positive resist material.

In the regions not shaded by the structured absorber layer, the resist material, when irradiated, receives a dose higher than the lower limit dose of the resist material along its entire thickness. In the regions shaded by the structured absorber layer, the resist material, when irradiated, receives a dose below the limit dose of the resist material over its entire thickness. In the regions shaded by the structured, partially absorbent absorber layer, a dose greater than the lower limit dose of the resist material is deposited during the irradiation only in the upper portion of the resist material; the lower portion receives a lower dose.

Since the resist material becomes soluble only at the locations that were previously exposed to a dose above the lower limit dose, microstructures are obtained which have regions of different structural height.

This method requires a resist material which has a precisely defined limit dose. On the other hand, the absorber characteristics of the X-ray mask must be carefully adjusted to the resist material.

German Patent No. 3,440,110 discloses another method of the above-mentioned type for the special case of columnar structures having a thin, longer section and a thicker, short section.

In this process, a resist plate of a thickness of about 0.5 mm is partially irradiated through an X-ray mask with high energy X-ray radiation from a synchrotron in such a manner that cylindrical regions result which have a diameter of about 30 $\mu$m at a predetermined grid spacing r and whose solubility is much greater than that of the non-irradiated regions of the resist plate. Then the resist plate is again partially irradiated from one side with the same grid spacing r, with, however, the penetration depth of the radiation being less than the thickness of the resist plate and the diameter of the irradiated regions being about 70 $\mu$m so that a thicker and shorter cylindrical irradiated region results. The thus irradiated and solubilized regions are removed by means of a liquid developer as disclosed, for example, in German Unexamined Published Patent Application DE-OS 3,039,110. This results in a configuration of columnar structures each having a thinner and a thicker section.

In principle, this method can be transferred to the production of microstructures having other lateral contours and also more than two different structural heights.

One basic problem in the two mentioned methods is that, although in the presently known resist systems there will be no removal during developing if doses below the limit dose are deposited, the mechanical characteristics and the resistance to solvents of these regions are noticeably worse. The height of the structures cannot be predetermined with sufficient accuracy because the weakening of the radiation and thus the dose deposited, is difficult to predetermine with increasing penetration depth.

SUMMARY OF THE INVENTION

It is the object of the invention to propose a method of producing stepped microstructures of the above-mentioned type in which the drawbacks of the prior art methods are avoided. The method is intended to permit tolerances in the step height within the micrometer range. Moreover, high solvent resistance and good mechanical characteristics for the microstructures are to be attained.

This is accomplished by the invention by providing the layer of resist material with microstructures on its side facing the radiation prior to performing a conventional method of producing microstructures using a mask, positive X-ray sensitive resist material, and a developer, as described in the Background section above. Further advantageous embodiments and modifications of the method according to the invention will become apparent from the detailed description.

BRIEF DESCRIPTION OF THE DRAWINGS

The method according to the invention will be described in an exemplary manner with reference to FIGS. 1 to 10.

FIGS. 1 2a to 2c, 3a to 3c, and 4a to 4e depict three different process variations with which the layer of a resist material can be provided with microstructures.

DETAILED DESCRIPTION OF THE PREFERRED EMBODIMENTS

Figure 5:
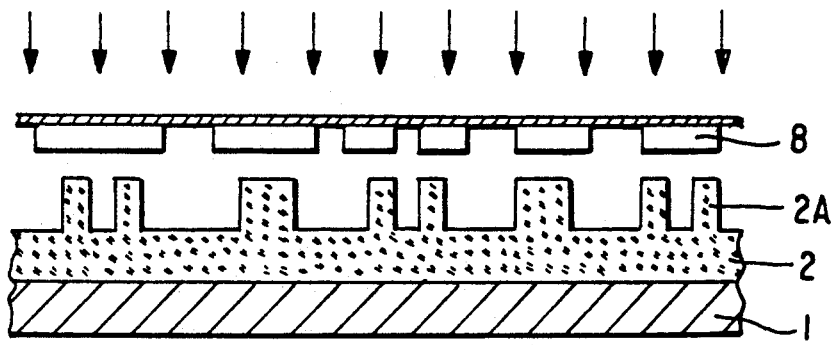
FIGS. 5 to 7 depict the production of microstructures that have regions of different structural height.

The layer of a resist material can be provided with microstructures according to three different variations of the method.

The first variation is illustrated in FIGS. 1, 2a, 3a and 4a and is presently described.

With the aid of a micromolding tool 3, a plastic microstructure is formed by way of reaction or injection molding on a resist layer 2 that is connected with a base plate 1. During the molding process, the mold nests 3A of the molding tool 3 are filled with a reaction resin or molding substance 7. The filled mold insert is then pressed onto the resist layer 2 as shown in FIG. 3a. In the course of the process, that is, during hardening or solidification of the plastic, a well adhering connection is established between the plastic of the microstructures and the resist layer 2. The microstructures are unmolded by way of a separating movement between molding tool 3 and base plate 1. The result is a resist layer 2 on which are disposed microstructures of plastic with a defined structural height (FIG. 4a). Since it can be ensured that molding substance 7 for the microstructures will not penetrate into the connecting plane between resist material 2 and plastic, the structured plastic 7a need not necessarily have resist characteristics.

The second variation is illustrated in FIGS. 1, 2b, 3b and 4b.

This variation for the production of microstructures on the surface of a resist layer 2 resides in that a further layer 5 having a fixed predetermined thickness from a few micrometers to several hundred micrometers is applied over the entire surface area of resist layer 2. In the course of a molding process, this layer is then structured in a stamping process (FIG. 3b) with the aid of a molding tool 6. The volume and thus the thickness of the stampable layer 5 must here be adapted to the volume of mold nests 6A. After solidification of the plastic, the microstructures are unmolded by way of a separating movement between molding tool 6 and base plate 1. A resist layer 2 is obtained in this way on which plastic microstructures are disposed that have a defined structural height (FIG. 4b).

The second variation is preferably selected if the layer 5 to be stamped has no resist characteristics or the resist material 2 cannot be structured by stamping.

The third variation is illustrated in FIGS. 1, 2c, 3c and 4c.

If layer 2 can be structured by stamping and if it exhibits sufficient resist characteristics, layer 5 of variation 2 is not required.

In this case, layer 2 is selected to be correspondingly thicker and is stamped directly with the aid of molding tool 6 and mold nests 6A.

Preferably a suitable base plate 1 is employed.

The production of the microstructures on the resist material 2 by stamping (variations 2 and 3) has the advantage compared to the reaction or injection molding process according to variation I, that, whenever necessary, an additional electrically conductive cover layer can be applied simultaneously to the end faces of the microstructures. The details of this particularly advantageous stamping process can be found in Patent Application P 4,010,669.1.

Such a conductive cover layer improves, in particular, the molding result in a subsequent metal deposition by electroplating.

In all three process variations, a sample is available after unmolding from the molding or stamping tool in which microstructures 2A, 5A, 7A are disposed on a continuous resist layer 2. This resist layer 2 is here preferably connected with a base plate 1.

The method of producing the microstructures with regions of different structural height will now be described with reference to the stamped resist layer according to FIG. 4c which is obtained according to variation 3.

According to FIG. 5, the sample structured by stamping and disposed on a base plate I includes resist material 2 with microstructures 2A. The sample is almost irradiated through a mask with perpendicularly directed synchrotron radiation. The mask includes regions 8 in which the synchrotron radiation is almost completely absorbed.

The mask having the radiation impermeable regions 8 is now aligned above structures 2A to correspond to the desired step shapes.

If structures 2A are not composed of resist material, for example, if they were produced according to variation 1, structures 2A may be shielded by regions 8.

If, however, structures 2A are composed of resist material, for example, if they were produced according to variation 3, a suitable arrangement of mask regions 8 also makes it possible to change the shape of structures 2A. In this way, structures produced with an existing stamping tool 6 can be changed subsequently, thus providing for the realization of a uniform shape that is independent of adjustment over the entire height of the structure.

Figure 6:
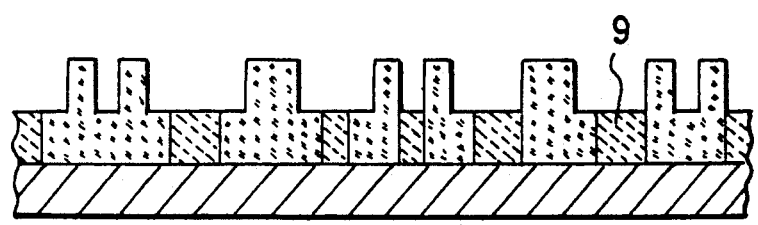

Portions 9 of resist material 2 and 2A, respectively, which are not shaded by mask regions 8 are now irradiated by X-ray or synchrotron radiation (FIG. 6) and are thus changed radiation-chemically.

Figure 7:
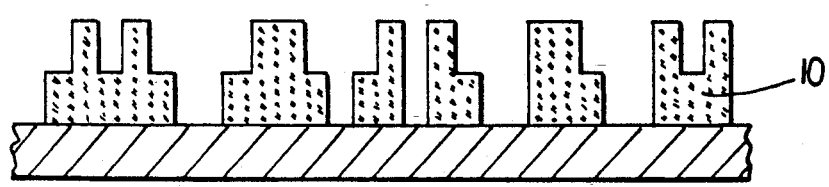

These regions 9 can be removed in a suitable solvent. Thus, after this process step, stepped plastic microstructures 10 exist whose step height is defined precisely by the thickness of the resistive layer (FIG. 7). The height of the structures on the lithographically produced base is predetermined by the depth of the mold nests in the molding tool.

Figure 8:
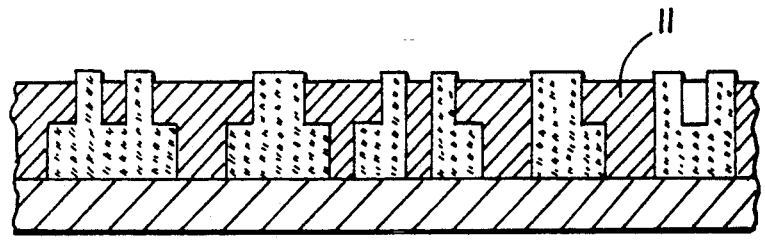
FIGS. 8 to 10 illustrate the possibilities for further processing of the microstructures produced according to the method of the invention.
Figure 9:
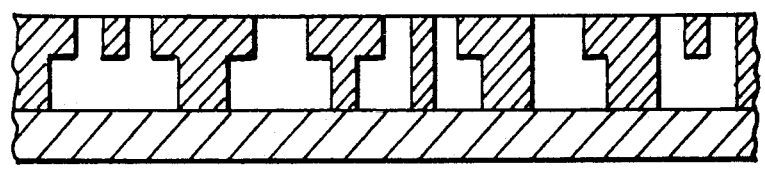

If the thus produced plastic structure is filled with metal 11, for example by electroplating (FIG. 8) and the resist structure is dissolved away after the electroplating step, a step-shaped metal structure results (FIG. 9). If the produced metal structures remain on the base plate, it is possible to produce with the method according to the invention overhanging or also bridge shaped structures.

Figure 10:
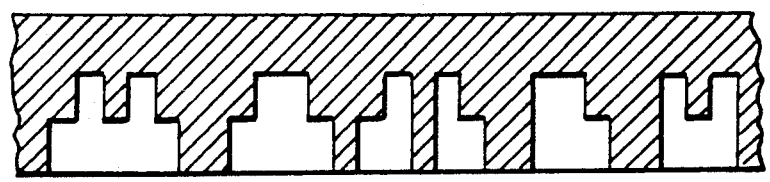

Moreover, by electroplating over the stepped resist structures (FIG. 8) it is possible to produce stepped molding tools (FIG. 10) with which the described steps can be performed again. This then results not only in two-step structures but, after repeating the method according to the invention n times, in n-step structures.

The technical details of the method steps of X-ray lithography and molding can be found in the two in-house reports, KfK-Bericht No. 3995 "Herstellung von Microstrukturen und grossem Aspektverhältnis und grosser Strukturhöhe mit Synchrotronstrahlung, Galvanoformung und Kunststoffabformung (LIGA-Verfahren)" (translation: Production of Microstructures Having a High Aspect Ratio And a High Structural Height by Means of Synchrotron Radiation, Shaping by Electroplating and Plastic Molding (LIGA Method)), by E. W. Becker, W. Ehrfeld, P. Hagmann, A. Maner, D. Münchmeyer, Kernforschungszentrum Karlsruhe, November, 1985, and No. 4267 "Untersuchungen zur Herstellung von galvanisierbaren Mikrostrukturen mit extremer Strukturhöhe durch Abformen mit Kunststoff im Reaktionsgiessverfahren" (translation: Examinations Regarding the Production of Electroplatable Microstructures Having Extreme Structural Height by Molding Plastic Material in a Reaction Casting Process), Kernforschungszentrum Karlsruhe, May, 1987.

With the method according to the invention, it is possible to produce multi-step microstructures having structural heights of several hundred micrometers with lateral dimensions in the micrometer range and step heights from a few micrometers up to several hundred micrometers. A significant advantage of the method according to the invention is that the tolerances of the step height lie in the micrometer range and are thus significantly less than those of the prior art methods.

If necessary, base plate 1 (FIGS. 1 to 9) mechanically reinforces the resist layer so that the various steps according to the invention can be performed with greater precision. After completion of the microstructured bodies, the base plate 1 in this case is separated. Preferably, the base plate is fixed to the resist layer 2. However, the base plate 1 may also be a part of the microstructured bodies to be produced.

In the selection of the base plate 1, the intended use of the stepped microstructures will have to be considered. A ceramic material or a semiconductor material are also suitable in addition to a metal. However, the base plate 1 may also be made of plastic.

Examples for preferred uses of the microstructures produced according to the invention are valve reeds for the production of microvalves, capacitive acceleration sensors, which are optimized with respect to their space requirement as well as gears or toothed rods having two different, superposed rings of teeth for the production of micro drive assemblies.

We claim:

1. A method of producing microstructures having regions of different structural height, comprising:
   providing a layer of positive resist material that is sensitive to X-ray radiation with microstructures on a side facing a source of X-rays;
   using a mask, partially irradiating with the X-rays the layer of a positive resist material that is sensitive to X-ray radiation; and
   removing irradiated regions with the aid of a developer;
   wherein the step of providing the microstructures on the layer of resist material comprises:
   (a) filling spaces between microstructures defined on a microstructured molding tool with a flowable, hardenable plastic;
   (b) pressing the molding tool filled in this manner onto the layer of resist material so that the plastic comes in contact with the layer of resist material between the microstructures of the molding tool;
   (c) hardening the plastic in the molding tool, producing a firm bond between the plastic and the layer of resist material; and
   (d) separating the molding tool from the microstructured plastic bonded to the layer of resist material.

2. A method of producing microstructures having regions of different structural height, comprising:
   providing a layer of positive resist material that is sensitive to X-ray radiation with microstructures on a side facing a source of X-rays;
   using a mask, partially irradiating with the X-rays the layer of a positive resist material that is sensitive to X-ray diffraction; and
   removing irradiated regions with the aid of a developer;
   wherein the step of providing the microstructures on the layer of resist material comprises:
   (a) producing a firm bond between a layer of a stampable plastic with the layer of resist material;
   (b) stamping the plastic layer with a molding tool having microstructures so that at least part of microstructure end faces of the molding tool expose the layer of resist material; and
   (c) separating the molding tool from the microstructured plastic layer bonded to the layer of resist material.

3. A method of producing microstructures having regions of different structural height, comprising:
   providing a layer of positive resist material that is sensitive to X-ray radiation with microstructures on a side facing a source of X-rays;
   using a mask, partially irradiating with the X-rays the layer of a positive resist material that is sensitive to X-ray radiation; and
   removing irradiated regions with the aid of a developer;
   wherein the layer of resist material is a first layer and wherein the step of providing the microstructures on the first layer of resist material comprises:
   (a) providing a second layer of resist material, the second layer being a thick, stampable layer of resist material, the first and second resist material layers having a combined thickness corresponding at least to the sum of the height of the first resist material layer and the maximum height of microstructures to be produced thereon;
   (b) stamping the second thick layer of resist material with a molding tool having microstructures with end faces, wherein at least part of the microstructure end faces of the tool penetrate into the second thick layer of resist material to such an extent that above this part of the microstructure end faces, the thickness of the first layer of resist material remains unchanged, the stamping thereby forming microstructures in the second thick layer of resist material;
   (c) separating the molding tool from the microstructured, second thick layer of resist material.

4. A method of producing microstructures having regions of different structural height, comprising:
   providing a layer of positive resist material that is sensitive to X-ray radiation with microstructures on a side facing a source of X-rays;
   using a mask, partially irradiating with the X-rays the layer of a positive resist material that is sensitive to X-ray radiation; and
   removing irradiated regions with the aid of a developer; the method further comprising connecting the layer of resist material with a base plate on a side of the layer of resist material not provided with microstructures.

5. A method according to claim 4, wherein the base plate is made of at least one of metal, ceramic, semiconductor material, and plastic.

* * * * *